(12) United States Patent
Sinclair et al.

(10) Patent No.: US 8,174,508 B2
(45) Date of Patent: May 8, 2012

(54) POINTING AND DATA ENTRY INPUT DEVICE

(75) Inventors: Michael J. Sinclair, Kirkland, WA (US);
Ray A. Bittner, Sammamish, WA (US);
David W. Voth, Kirkland, WA (US)

(73) Assignee: Microsoft Corporation, Redmond, WA (US)

( * ) Notice: Subject to any disclaimer, the term of this patent is extended or adjusted under 35 U.S.C. 154(b) by 879 days.

(21) Appl. No.: 11/941,985

(22) Filed: Nov. 19, 2007

(65) Prior Publication Data

US 2009/0128511 A1 May 21, 2009

(51) Int. Cl.
*G06F 3/045* (2006.01)
(52) U.S. Cl. ............. 345/174; 345/173; 178/18.05; 178/18.07
(58) Field of Classification Search .......... 345/174, 345/213, 98; 178/18.01, 18.08, 18.05, 18.07; 463/37–38
See application file for complete search history.

(56) References Cited

U.S. PATENT DOCUMENTS

| | | | |
|---|---|---|---|
| 5,574,262 A * | 11/1996 | Petty | 178/18.02 |
| 6,879,930 B2 | 4/2005 | Sinclair et al. | |
| 7,109,978 B2 | 9/2006 | Gillespie et al. | |
| 7,151,528 B2 | 12/2006 | Taylor et al. | |
| 7,248,248 B2 | 7/2007 | Lampson | |
| 7,532,205 B2 * | 5/2009 | Gillespie et al. | 345/173 |
| 2002/0145602 A1* | 10/2002 | Matsueda | 345/213 |
| 2002/0190727 A1 | 12/2002 | Morimoto | |
| 2003/0025679 A1 | 2/2003 | Taylor et al. | |
| 2005/0030048 A1 | 2/2005 | Bolender et al. | |
| 2005/0270276 A1* | 12/2005 | Sugimoto et al. | 345/173 |
| 2006/0192690 A1 | 8/2006 | Philipp | |
| 2006/0254894 A1 | 11/2006 | Jung et al. | |
| 2006/0274050 A1 | 12/2006 | Lii | |
| 2007/0040815 A1 | 2/2007 | Rosenberg et al. | |
| 2007/0075710 A1 | 4/2007 | Hargreaves et al. | |
| 2007/0075983 A1 | 4/2007 | Chiu et al. | |
| 2007/0109274 A1 | 5/2007 | Reynolds | |
| 2007/0165005 A1 | 7/2007 | Lii et al. | |
| 2007/0182722 A1 | 8/2007 | Hotelling et al. | |

FOREIGN PATENT DOCUMENTS

EP 1286250 A2 2/2003
(Continued)

OTHER PUBLICATIONS

Search Report and Written Opinion dated Apr. 29, 2009 for International application No. PCT/US2008/078050, filed Sep. 29, 2008.

(Continued)

*Primary Examiner* — Lun-Yi Lao
*Assistant Examiner* — Shaheda Abdin
(74) *Attorney, Agent, or Firm* — Westman, Champlin & Kelly, P.A.

(57) ABSTRACT

An input device includes an array of adjacent capacitive sensors arranged into rows and columns. Each capacitive sensor exhibits a capacitance characteristic when in proximity to a conductive element. A plurality of mechanical hysteresis mechanisms are each deposited on and in contact with each of the capacitive sensors and configured to be actuated by a corresponding push button. Each capacitive sensor exhibits an electrical characteristic upon actuation of the corresponding mechanical hysteresis mechanism. An insulating overlay layer positioned over the array of capacitive sensors and the plurality of mechanical hysteresis mechanisms defines each push button and defines a surface for accommodating the conductive element.

16 Claims, 7 Drawing Sheets

FOREIGN PATENT DOCUMENTS

| EP | 1672798 A2 | 6/2006 |
|---|---|---|
| JP | 2002150904 A | 5/2002 |
| WO | WO2007124333 A2 | 11/2007 |

OTHER PUBLICATIONS

Rekimoto, et al., "PreSense: Interaction Techniques for Finger Sensing Input Devices", Sony Computer Science Laboratories, Inc., Japan.

Rekimoto, et al., "SmartSkin: An Infrastructure for Freehand Manipulation on Interactive Surfaces", Two-Handed Interaction, vol. No. 4, Issue No. 1, pp. 113-120, Apr. 2002.

"Capacitive Position Sensing", http://www/synaptics.com/technology/cps.cfm (last visited Nov. 6, 2007), pp. 1-2.

"Input Devices", ALPS, http://www3.alps.co.jp/WebObjects/catalog.woa/HTML/E/InputDevice/index_e.html (last visited Nov. 6, 2007), pp. 1-3.

"Metal Domes", Snaptron, Inc., http://snaptron.com/metaldomes.cfm (last visited Nov. 6, 2007), p. 1.

Notice of First Chinese Official Action dated Oct. 25, 2011, for Appln. No. 200880117492.5 (11 pgs) with English translation of Office Action.

"European Search Report", Mailed Date: Jul. 25, 2011, Application No. EP/08852721, Filed Date: Jul. 22, 2011, pp. 8.

Poupyrev, et al., "Ambient Touch: Designing Tactile Interfaces for Handheld Devices", Date: Oct. 27-30, 2002, pp. 51-60, vol. 4, Issue: 2, Japan.

Rekimoto, et al. "PreSense: Interaction Techniques for Finger Sensing Input Devices," Sony Computer Science Laboratories Inc. Japan. 2003.

European Communication dated Aug. 9, 2011 for Serial No. 08852721.3-2212/2223200, (PCT/US2008078050), 1 pg. 2011.

Extended European Search Report dated Jul. 22, 2011 for Serial No. 08852721.3-2212/2223200 (PCT/US2008078050), 8 pgs.

* cited by examiner

POINTING AND DATA ENTRY INPUT DEVICE

BACKGROUND

User interfaces on mobile computing devices encounter various problems such as sensitivity to price, size, storage space requirements, power consumption and user ease of interaction. Typically, mobile computing devices include a input tactile pad (or finger-screen contact) and separate discrete tactile push buttons.

Input pads are position indicating devices that utilize capacitive input sensing technology to control cursoring, scrolling, gesturing and the like on a display in an electronic device. Capacitive touch sensing technology is rooted in the understanding that when two electrically conductive objects come near each other, their electric fields interact to form a capacitor. For example, electrodes and a human finger or a stylus are conductive elements. When a user places their finger near an electrode, a capacitor forms between the finger and the electrode.

Conventional input pads include a first set of conductive traces or grid layer that runs in a first direction to form rows and a second set of conductive traces or grid layer that runs in a second direction orthogonal to the first direction to form columns. Along each of the sets of conductive traces includes a multiplex of capacitive sensors or electrodes. The number and spacing of electrodes along each of the sets of conductive traces depends on the desired resolution of sensing. An integrated circuit is coupled to the array of conductive traces and capacitive sensors and responds to changes in capacitance between capacitive sensors and between a sensor and virtual ground.

In general, conventional input pads having a multiplex of capacitive sensors on first and second sets of conductive traces (or grid layers) includes a top layer having a continuous surface. Any breaks, voids or isolated sections of the top layer of the input tactile pad prevents the capacitive sensing circuitry from making accurate capacitive readings to determine an accurate position for the display.

Merging an input pad and tactile push buttons on a mobile computing device can address the mobile device problems related to size. However, merging these two forms of input using conventional input pad technology can lead to increased problems regarding price, physical size requirements and complexity.

The discussion above is merely provided for general background information and is not intended to be used as an aid in determining the scope of the claimed subject matter.

SUMMARY

This Summary is provided to introduce a selection of concepts in a simplified form that are further described below in the Detailed Description. This Summary is not intended to identify key features or essential features of the claimed subject matter, nor is it intended to be used as an aid in determining the scope of the claimed subject matter. The claimed subject matter is not limited to implementations that solve any or all disadvantages noted in the background.

An input device includes an array of adjacent capacitive sensors arranged into rows and columns that exhibit a first capacitance characteristic when in proximity to a conductive element and exhibit a second electrical characteristic when a corresponding mechanical hysteresis mechanism is actuated by a push button. An insulating overlay layer is positioned over each capacitive sensor and over each mechanical hysteresis mechanism that is deposited on and in contact with each capacitive sensor. A position of the conductive element is determined based on capacitance values of each capacitive sensor and a proportional contribution of each row and column of the array of adjacent capacitive sensors.

DETAILED DESCRIPTION

Embodiments described are directed to mobile computing devices, such as laptops, tablet PCs, personal digital assistants (PDAs), cell phones, digital music and video players and other types of small handheld devices. However, embodiments described can be used in other types of computing and non-computing applications that utilize multiple types of input devices.

Figure 1:
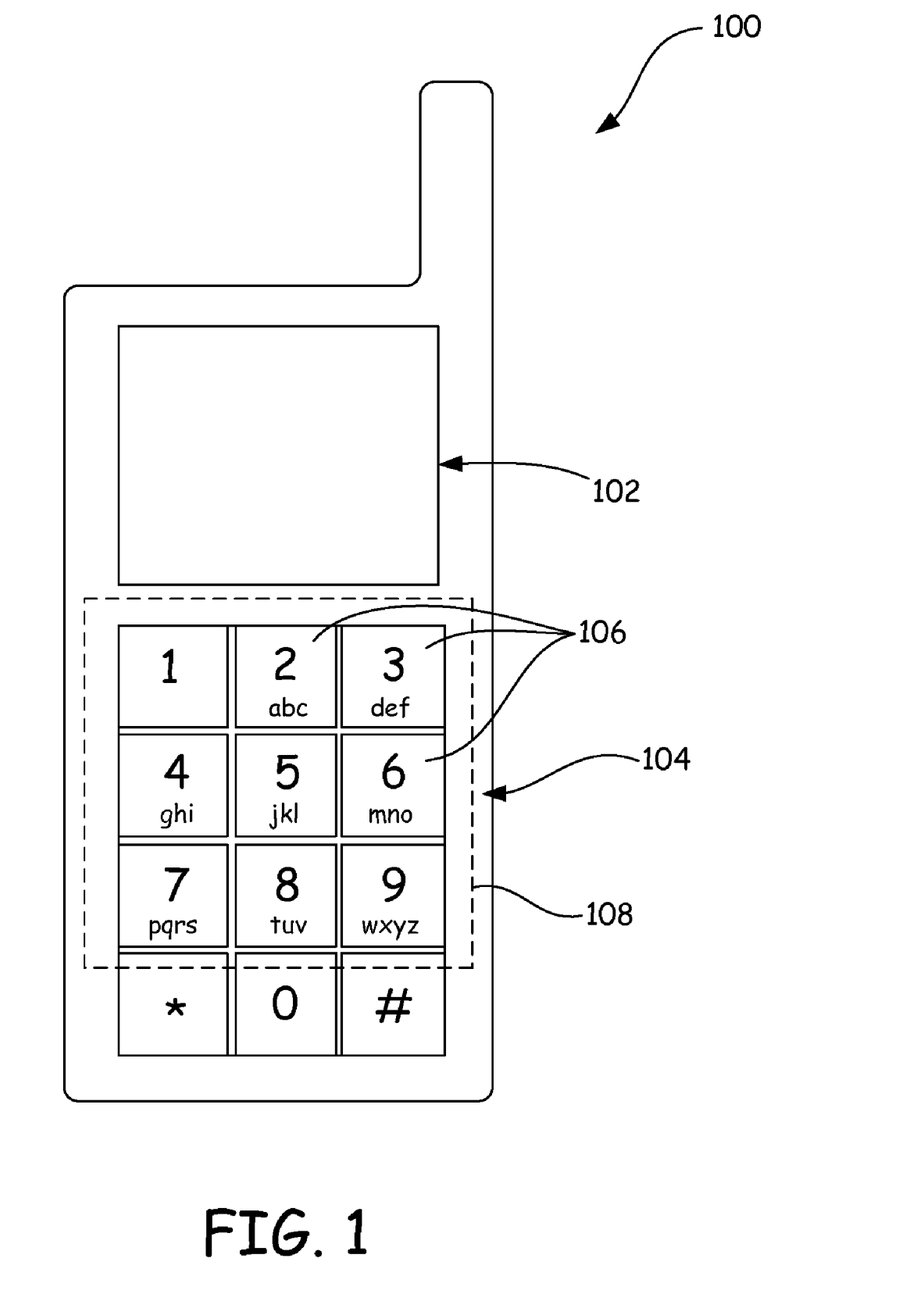
FIG. 1 illustrates a simplified front view of a mobile device under one embodiment.

FIG. 1 illustrates a simplified front view of a mobile device 100 under one embodiment. In FIG. 1, mobile device 100 is illustrated as being a cell phone. However, as previously discussed, mobile device 100 is not limited to cell phones and can be one of a wide variety of different computing and non-computing devices. Mobile device 100 includes a display 102 and an input device 104. Input device 104 can receive both two dimensional pointing (cursoring, scrolling, gesturing, etc.) input and receive data entry input. As illustrated in FIG. 1, input device 104 provides a plurality of push buttons 106 as well as includes an input touch pad 108. Tactile push buttons 106 receive data entry input upon actuation of push buttons 106, while the surface area of tactile push buttons 106 receives two dimensional pointing information such that input touch pad 108 can control cursoring, scrolling, gesturing, etc. on display 102. The two-dimensional pointing information is provided by a conductive element, such as a user's finger or a stylus.

Figure 2:
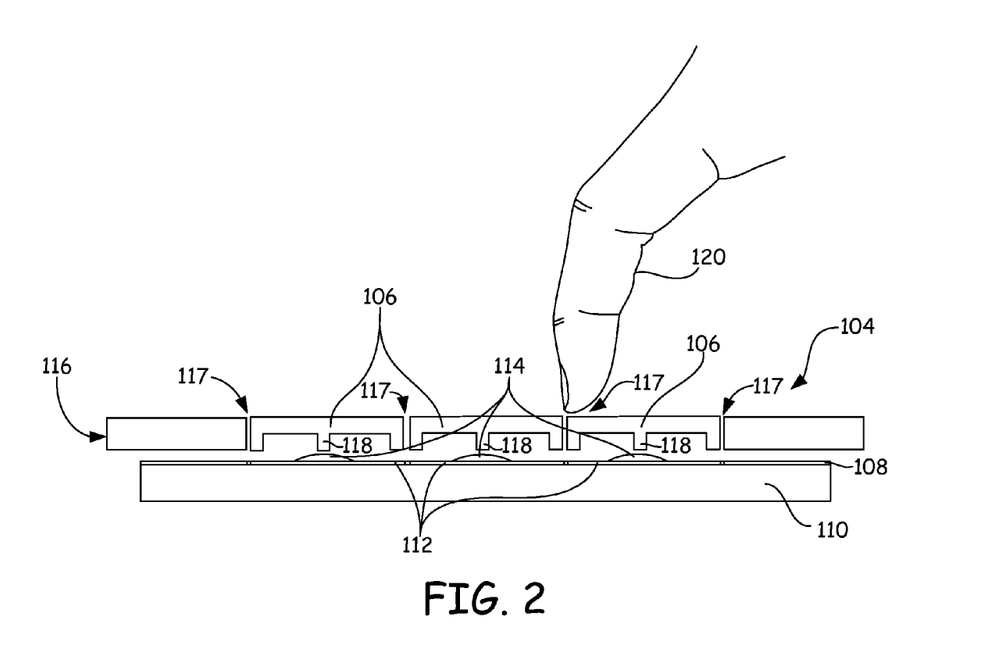
FIG. 2 illustrates a schematic illustration of a side view of the input device illustrated in FIG. 1.

FIG. 2 illustrates a schematic illustration of a side view of input device 104 illustrated in FIG. 1. Input device 104 includes a printed circuit board (PCB) 110 having a controller that will be discussed in detail below in FIG. 5. Coupled to PCB 110 is input touch pad 108 having a plurality of capacitive sensors or electrodes 112. FIG. 2 illustrates three such capacitive sensors or electrodes 112. Deposited on input touch pad 108 includes a plurality of mechanical hysteresis mechanisms 114. An example mechanical hysteresis mechanism 114 includes a snap dome as illustrated in FIG. 2. Each mechanical hysteresis mechanism 114 is deposited on and in at least partial electrical contact with one of the capacitive sensors 112. Each capacitive sensor 112 paired with a ground pad (as illustrated in further detail in FIG. 4). Each mechanical hysteresis mechanism 114 comes into contact with the corresponding ground pad when actuated. This contact indicates entry of data from the push button. It should be realized that the snap dome push buttons is just one implementation. In another embodiment, an input device could instead include clear conductors that have been overlaid onto a display or input touch pad. In still another embodiment, other types of conductors can be used that do not use push buttons, such as in laptop applications, or on a mouse or game controller.

Input device 104 also includes an insulating overlay layer 116 positioned above and over PCB 110, capacitive sensors 112 and mechanical hysteresis mechanisms 114. For example, overlay layer 116 can be a continuous rigid sheet. In such an example, overlay layer 116 includes articulated cut-out sections 117 that define the plurality of tactile push buttons 106. In another example, overlay layer 116 can be a flexible membrane having discrete push buttons 106. Each push button 106 corresponds with one of the capacitive sensors 112 and includes a protrusion or nib 118. Each protrusion 118 of each push button 106 is configured to actuate one of the mechanical hysteresis mechanisms 114 such that the mechanical hysteresis mechanisms are deformed into contact with a ground pad. In another embodiment, the nib can be coupled to the snap dome instead of the under-side of the push button. Therefore, capacitive sensors 112 can sense a conductive element 120, such as a user's finger (as illustrated in FIG. 2) or stylus, for determining two-dimensional pointing information and can also sense the conductive element actuating the mechanical hysteresis mechanisms 114 with push buttons 106.

Figure 3:
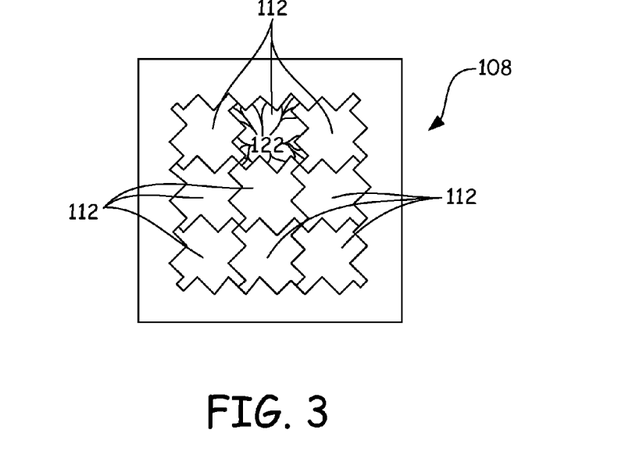
FIG. 3 illustrates a simplified top view of the input tactile pad illustrated in FIGS. 1 and 2.

FIG. 3 illustrates a simplified top view of the input touch pad 108 illustrated in FIGS. 1 and 2. Input touch pad 108 includes an array of adjacent capacitive sensors or electrodes 112 as illustrated in FIG. 2. The array of adjacent capacitive sensors 112 are arranged into rows and columns. As illustrated in FIG. 3, input touch pad 108 includes an array of three rows of capacitive sensors 112 and three columns of capacitive sensors 112. However, it should be understood that although FIG. 3 illustrates a 3×3 array of capacitive sensors 112, input touch pad 108 can have any amount of capacitive sensors. For example, input touch pad 108 can include a 4×4 array of capacitive sensors and etc.

As illustrated in FIG. 3, each capacitive sensor 112 includes a plurality of boundary edges 122. Instead of each adjacent capacitive sensor 112 sharing a single boundary edge, each adjacent capacitive sensor 112 shares a plurality of boundary edges 122. Boundary edges 122 are a zig-zag type of boundary edges. Such boundary edges 122 are used to more linearize or graduate the capacitance transition between capacitive sensors 112. Without the zig-zag type of boundary edges between capacitive sensors 112, the change in capacitance as a conductive element 120 (FIG. 2), moves between capacitive sensors 112 would be more abrupt and hence more difficult to determine the inter-electrode position. Capacitive sensors 112 that share a plurality of boundary edges 122 act like an anti-aliasing filter, which is a better conductor layout than that of capacitive sensors that share a single boundary edge especially in an under-sampled environment.

Figure 4:
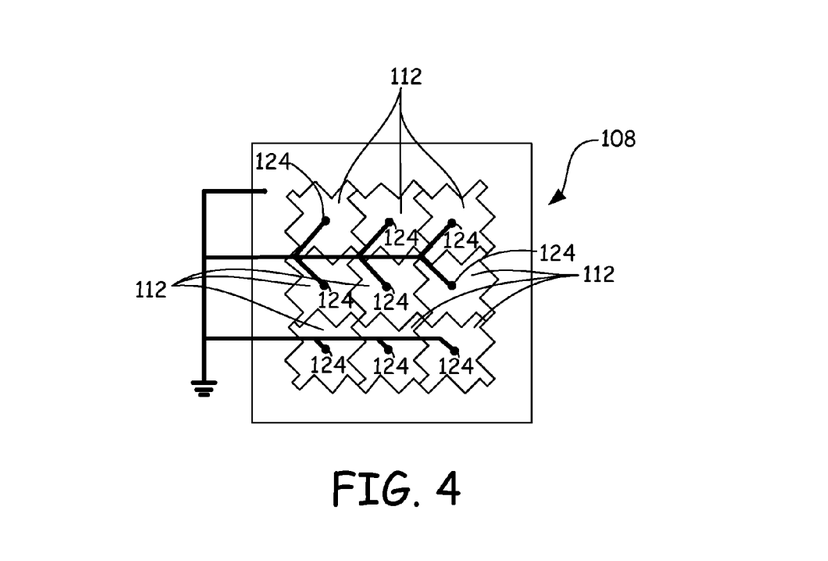
FIG. 4 illustrates a simplified schematic top view of the input tactile pad illustrated in FIGS. 1-3.

FIG. 4 illustrates a simplified schematic top view of the input touch pad 108 illustrated in FIGS. 1-3. As previously mentioned, each capacitive sensor 112 includes a ground pad 124. In general, each ground pad 124 is positioned centrally on each capacitive sensor 112.

Figure 5:
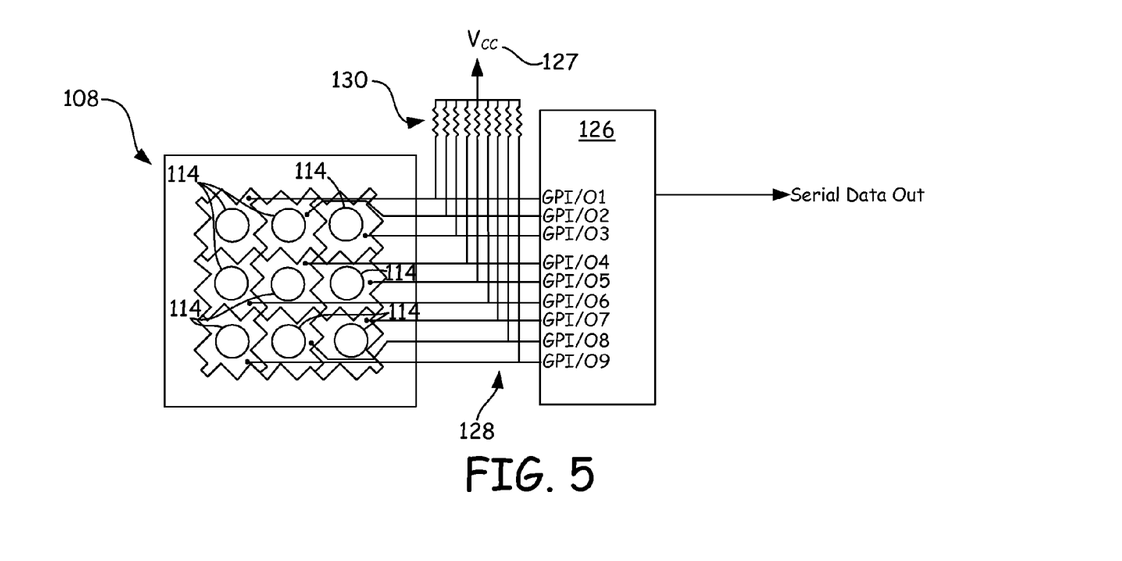
FIG. 5 illustrates a simplified schematic top view of the input tactile pad illustrated in FIGS. 1-4 coupled to a controller and a power supply.

FIG. 5 illustrates a simplified schematic top view of the input touch pad 108 illustrated in FIGS. 1-4 coupled to a controller 126 and a power supply 127. As previously discussed, a plurality of mechanical hysteresis mechanisms 114 are deposited on and in contact with input touch pad 108. For example, in FIGS. 1-4, each mechanical hysteresis mechanism 114 is a snap dome and is in contact with one of the plurality of capacitive sensors 112. Each snap dome is in contact with one of the capacitive sensors at its outer diameter edge and the center of each snap dome is raised above one of the capacitive sensors 112. In particular, the center of each snap dome is raised above one of the ground pads 124 (FIG. 4) positioned centrally on each capacitive sensor 112 such that each snap dome comes into contact with one of the ground pads upon actuation of its corresponding push button.

Each capacitive sensor 112 exhibits a capacitance characteristic when in close proximity to a conductive element 120 (FIG. 2). In particular, when conductive element 120 is in close proximity to a capacitive sensor 112, the apparent capacitance of the capacitive sensor 112 will increase. The capacitance characteristic allows for a determination of a position of the conductive element 120 in relation to an array of adjacent capacitance sensors of input touch pad 108. In addition, each capacitive sensor 112 exhibits an electrical characteristic upon actuation of a corresponding mechanical hysteresis mechanism 114. In particular, each capacitive sensor 112 exhibits an electrical characteristic when a corresponding mechanical hysteresis mechanism 114 comes into contact with a ground pad 124 of each capacitive sensor 112. Such contact will substantially immediately discharge the capacitive sensor 112. This electrical characteristic, which is electrically distinguishable from the capacitor characteristic, indicates push button data entry of information that is assigned to that particular capacitive sensor 112. For example, if a push button 106 that corresponds to the capacitive sensor 112 includes the numeral one, then input device 104 is indicative of the number one (see FIG. 1).

As also illustrated in FIG. 5, controller 126 includes a plurality of input/output pins. For example, controller 126 can be a Texas Instruments MSP430 line of microcontrollers having a low leakage and input pin current, typically around 50 nano amps. Each capacitive sensor 112 of input touch pad 108 is coupled to one of the plurality of input/output pins of controller 126 by a conductor 128. To determine the position of a conductive element 120 related to an array of capacitive sensors 112, controller 126 is configured to determine the relative intrinsic capacitance of each of the capacitive sensors 112. In one embodiment, controller 126 can determine the relative intrinsic capacitance of each of the sensors 112 by timing the charging of each capacitive sensor 112. Each capacitive sensor 112 is charged by power supply 127 through one of the plurality of resistors 130 from an initial 0 volts or logic "0" to a logic "1" threshold. In another embodiment, controller 126 can determine the relative intrinsic capacitance of each of the sensors 112 by timing the discharging of each capacitive sensor 112. Each capacitive sensor 112 begins at a charged logic "1" by power supply 127 and then is discharged through each ground pad 124 to a logic "0." The power supply feeding the resistors and each capacitive sensor ground pad 124 of the latter embodiment includes a reversed polarity compared with the former embodiment. Capacitance of a select one of the capacitive sensors 112 is measured by: 1)

programming the input/output pin that the capacitive sensor is coupled to an output at a logical "0" to ground the particular capacitive sensor and drain any of its charge; 2) programming the input/output pin that the capacitive sensor is coupled to an input such that power supply 127 through a resistor 130 slowly charges the capacitive sensor above ground to a logical "1"; and 3) timing the charging transition of the capacitive sensor from logical "0" to logical "1."

Figure 6:
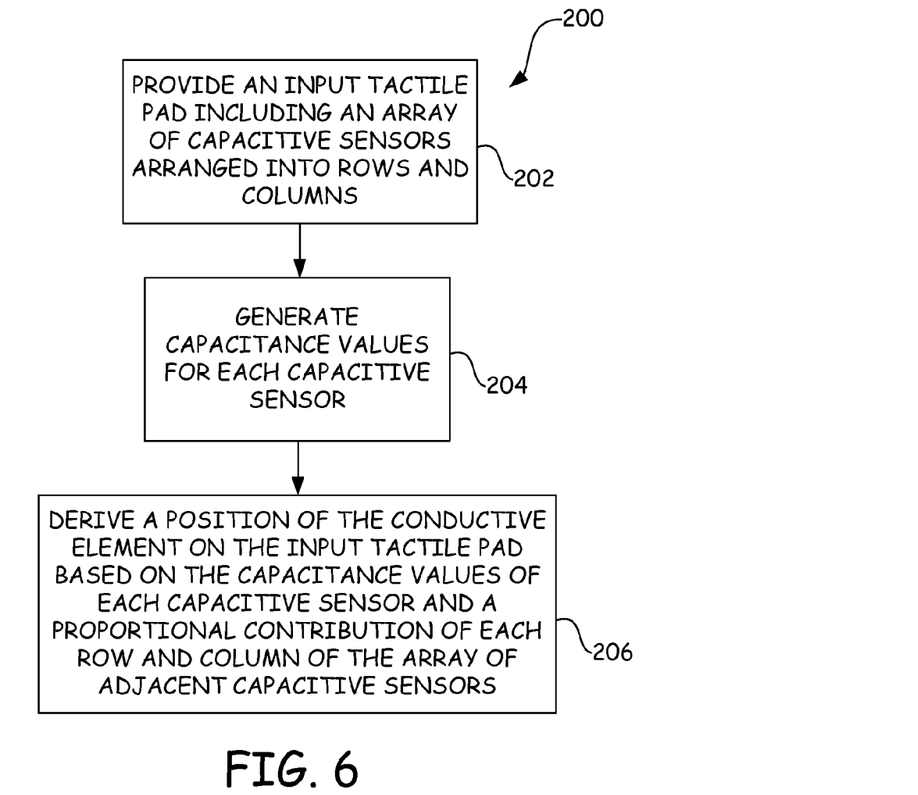
FIG. 6 is a flowchart illustrating a method of determining a position of the conductive element illustrated in FIG. 2.

FIG. 6 is a flowchart 200 illustrating a method of determining a position of conductive element 120. At block 202, input touch pad 108 including the array of capacitive sensors 112 that are arranged in rows and columns is provided. Each capacitive sensor 112 exhibits an increase in capacitance when in proximity to conductive element 120. A position of conductive element 120 with respect to the array of adjacent capacitive sensors is determined based on the determined capacitance of the capacitive sensors. At block 204, raw capacitance values for each capacitive sensor are generated. The charging time of a capacitor is determined by the equation:

$$V_C(t) = V_{CC}[1 - e^{(-t/RC)}]$$ (Equation 1)

where $V_C(t)$ is voltage on a capacitive sensor as a function to time, $V_{CC}$ is the power supply voltage, t is the time, R is the charging resistance and C is the total capacitance of the capacitive sensor, input/output pins of the controller, the resistor, interconnection wiring and possible proximity of conductive element 120. It is assumed that the capacitance exhibited by the capacitive sensor, input/output pins of the controller, the resistor and the interconnection wiring is relatively constant and only the proximity of conductive element 120 alters the total capacitance C. As demonstrated by Equation 1, by moving conductive element 120 closer to the capacitive sensor, charging time is increased and thus a longer period is realized for capacitive sensor 112 to reach a logical "1."

Figure 7:
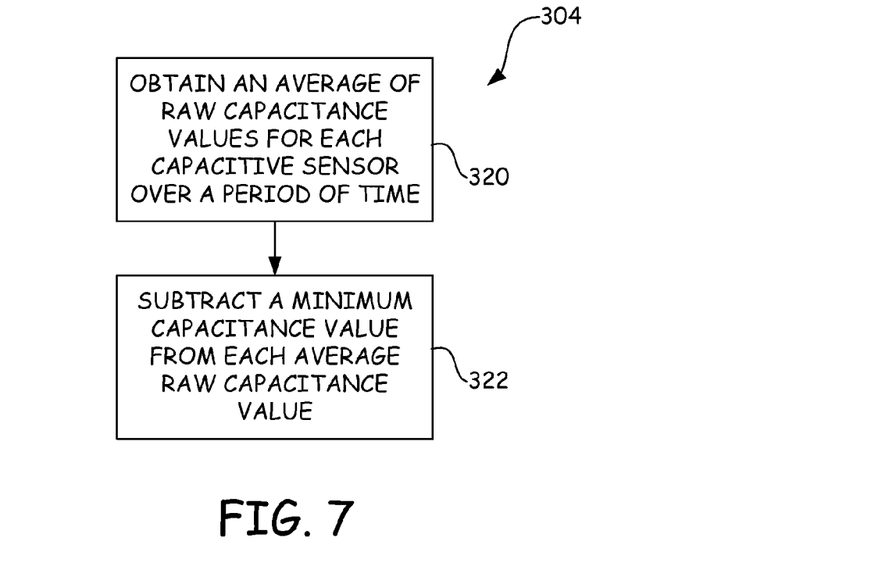
FIG. 7 is a flowchart illustrating the generation of capacitance values for each capacitive sensor as described in the flowchart illustrated in FIG. 6.

Flowchart 304 of FIG. 7 is provided to illustrate the generation of capacitance values for each capacitive sensor as described in block 204 of flowchart 200. At block 320, raw capacitance values for each capacitive sensor are obtained by timing the logic 0 to logic 1 transition interval and are averaged over a period of time to remove at least some of the electrical noise. In general, the period of time selected for averaging raw capacitance values is a relatively short period of time. A short period of time can remove noise, yet, not overly degrade the responsiveness of the system. At block 322, a minimum capacitance value is subtracted from each averaged raw capacitance value. The minimum capacitance value represents the value that each capacitive sensor will return when conductive element 120, such as a finger or stylus, is distal to the sensor. By subtracting the minimum capacitance value from each averaged raw capacitance value, the "DC component" or "DC offset" of the sensor value is removed such that the remaining counts are numerically significant. For example, a select capacitive sensor 112 can have a minimum capacitance value of 2000. When a conductive element, such as conductive element 120, is present, this value can vary from 2000 to 2205. By subtracting the minimum capacitance value, a modified capacitance value is given that ranges between 0 to 205. Such a range has a better proportionality factor than the raw capacitance values of 2000 to 2205. Determining a minimum capacitance value is discussed in detail below in regards to FIG. 8 and is computed to remove its contribution from the raw capacitive measurement of each capacitive sensor.

Collecting the minimum capacitive value is difficult in that it needs to be done in the presence of noise and normal use. It is not sufficient to merely take the capacitance values of each capacitive sensor when the device is turned on and assume that those values are the minimum values that will be returned. When input device 104 is turned on, there can be some conductive object in close proximity that will generate a high capacitance value. In addition, the minimum capacitance value will drift over time due to temperature, moisture, aging and other factors. A minimum capacitive value that tracks these types of changes, but rejects the higher capacitance values encountered in normal use is desired.

Figure 8:
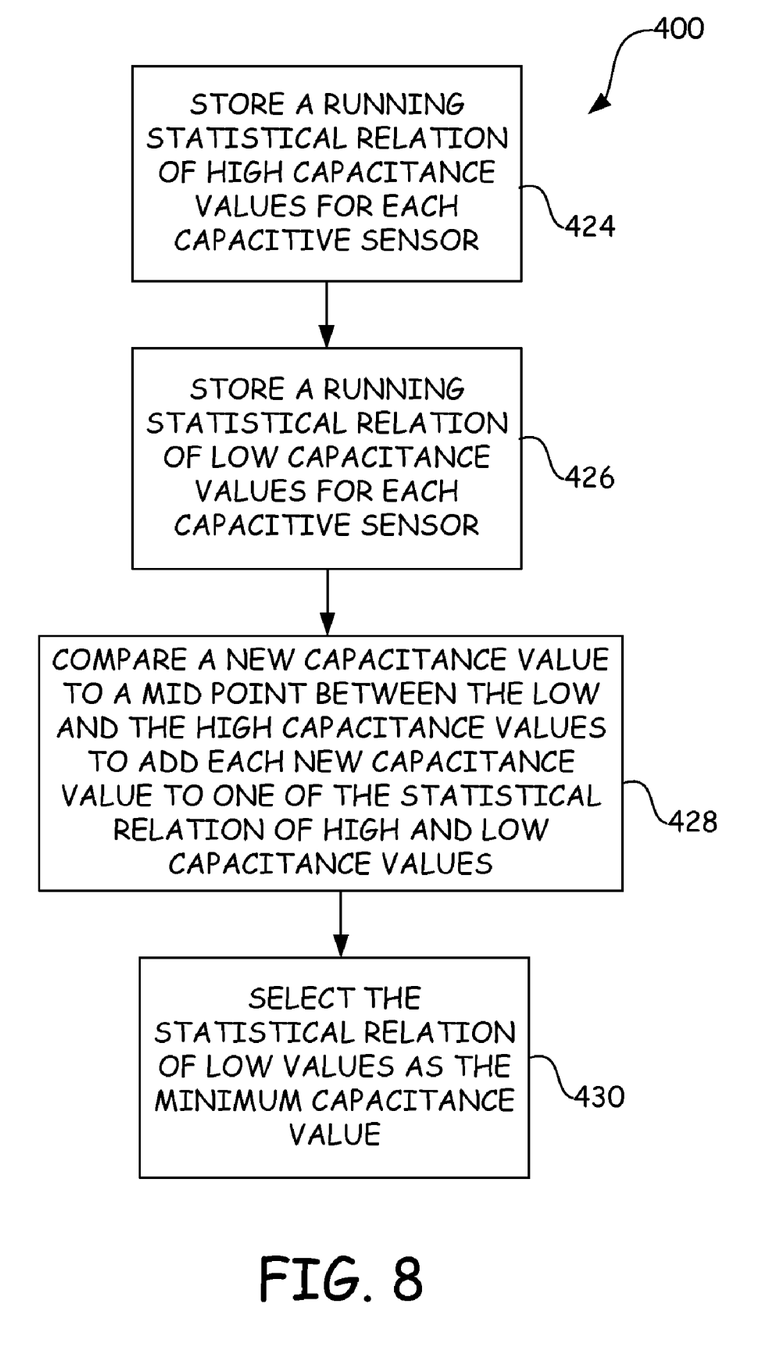
FIG. 8 is a flowchart illustrating a method of determining a minimum capacitive value under one embodiment.

In one embodiment, FIG. 8 is a flowchart 400 illustrating a method of determining a minimum capacitive value. At block 424, a running statistical relation of high capacitance values for each capacitive sensor is stored. At block 426, a running statistical relation of low capacitance values for each capacitive sensor is stored. Example statistical relations that can be used for both the high capacitance values and the low capacitance values include averages, means, modes, standard deviations and etc. At block 428, a new capacitance value is compared to a mid point between the low and the high capacitance values to add each new capacitance value to one of the statistical relation of high and low capacitance values. For example, if the new capacitive reading is above the mid point, it is added to the high capacitance values by employing a statistical relation. If the new capacitive reading is below the mid point, it is added to the low capacitance values by employing a statistical relation. At block 430, the statistical relation of low values is selected as the minimum capacitance value. Taking a statistical relation of values over too short of a time period can cause the two statistical relation of values to track noise spikes too closely and the statistical relation of values will drift off of a true center. However, if the statistical relation of values are considered over too long of a time period, the values will not correct themselves quickly enough in the event that initialization or a temporary condition caused a long series of abnormal readings. In the embodiment illustrated in FIG. 8, eighteen values will need to be stored at any given time in an example 3×3 array of adjacent capacitive sensors. These values include nine low values for each sensor and nine high values for each sensor. Such an amount of values can occupy a significant amount of memory of which input device 104 can be limited.

Figure 9:
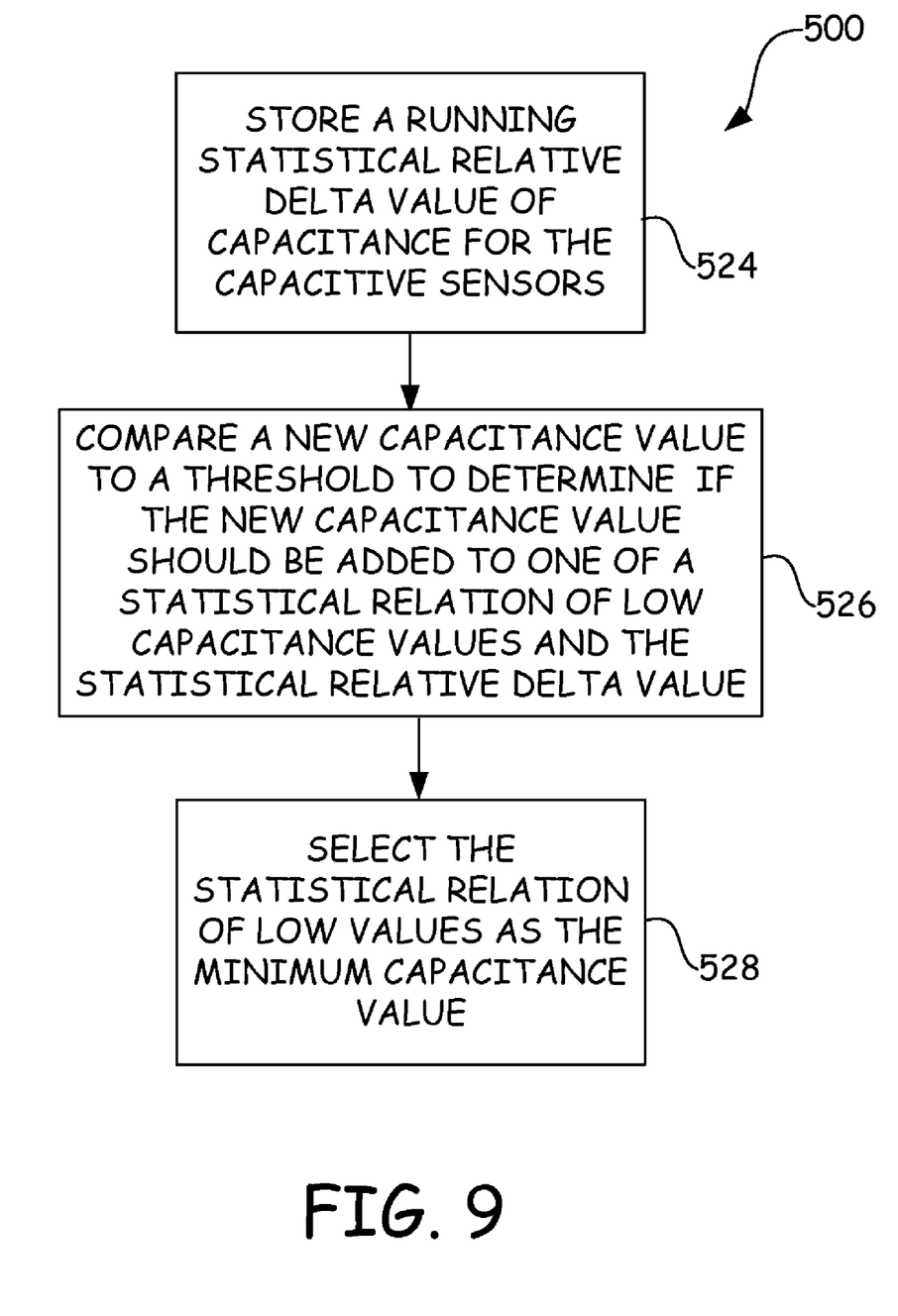
FIG. 9 is a flowchart illustrating a method of determining a minimum capacitive value under one embodiment.

In another embodiment, FIG. 9 is a flowchart 500 illustrating a method of determining a minimum capacitive value. To reduce the amount of memory used for the minimum capacitance value, an assumption is made that the capacitive change introduced by the presence of conductive element 120 is roughly the same for all sensors in the array of capacitive sensors. This assumption can easily be made if the surface area of each sensor is approximately the same. At block 524, a running statistically relative delta value of capacitance for the capacitive sensors is stored. The statistically relative delta value is the statistical relational difference between a statistical relation of low capacitance values and a statistical relation of high capacitance values. At block 526, a new capacitance value is compared to a threshold to determine if the new capacitance value should be added to a statistical relation of low capacitance values or should be added to the statistically relative delta value. When a new reading is taken it is compared to the threshold. The threshold is the statistical relation of low capacitance values added to half of the statistically relative delta value. Example statistical relations that can be used for both the low capacitance values and the delta value include averages, means, modes, standard deviations and etc. If the new reading is lower than the threshold, then it is added to the low capacitance values by employing a statistical relation. If the new reading is higher than the threshold, then the new reading minus the statistical relation of low capacitance values is added to the delta value by employing a statistical relation. Since only one statistically relative delta value is maintained across all sensors in the array, the amount of memory saved is equivalent to (n−1)*size of(statistical relation of high capacitance values), where n is the number of sensors in an array. For example, in a 3×3 array, the first embodiment (FIG. 8) stores eighteen values, while in the second embodiment (FIG. 9), 10 values (9 statistical relation of low capacitance values and 1 statistically relative delta value) are stored.

With reference back to FIG. 6, at block 206, a position of conductive element 120 on the input touch pad is derived based on the capacitance values of each sensor and a proportional contribution of each row and column of the array of adjacent capacitive sensors. Determining the sum of the capacitance in each row can be used to calculate that row's proportional contribution to a Y coordinate of position of conductive element 120, and determining the sum of the capacitance in each column can be used to calculate that column's proportional contribution to an X coordinate of position of conductive element 120. To make these calculations, the array of adjacent capacitive sensors is assigned fractional positions between 0 and 1 for both rows and columns of the array.

Figure 10:
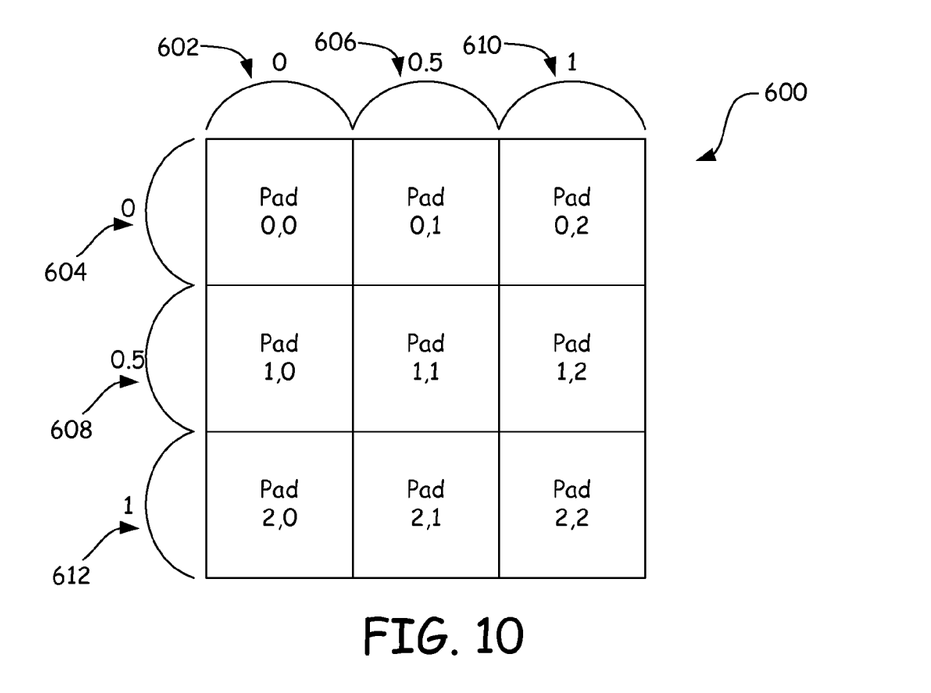
FIG. 10 illustrates a schematic diagram of an example array of adjacent capacitive sensors.

FIG. 10 illustrates a schematic diagram of an example array 600 of adjacent capacitive sensors. In FIG. 10, the example array 600 of adjacent capacitive sensors is a 3×3 array. Each row 604, 608, 612 and each column 602, 606, 610 are assigned a weight. As illustrated in the example in FIG. 10, the leftmost column or first column (column 0) 602 and topmost row or first row (row 0) 604 are assigned a weight of 0, the middle column or second column (column 1) 606 and the middle row or second row (row 1) 608 are assigned a weight of 0.5 and the rightmost column or third column (column 2) 610 and the bottommost row or third row (row 2) 612 are assigned a weight of 1. Although FIG. 10 illustrates the weights increasing from the leftmost column 602 to the rightmost column 610 and increasing from the topmost row 604 to a bottommost row 612, it should be realized that the weights can increase from the rightmost column 610 to the leftmost column 602 and increase from the bottommost row 612 to the topmost row 604. These weights represent the range of values that are desired as output for scaling purposes. It should be noted that the weight of each column and each row can be more intermediate than that which is illustrated in FIG. 10. For example, the array of adjacent capacitive sensors can be of a different size, such as a 4×4 array. In such a case, the range of weights from the leftmost column to the rightmost column will be between 0 and 1 and the range of weights from the topmost row to the bottommost row will be between 0 and 1. Therefore, each middle row and middle column would have a fractional weight of 0.3333 and a fractional weight of 0.6667.

Figure 11:
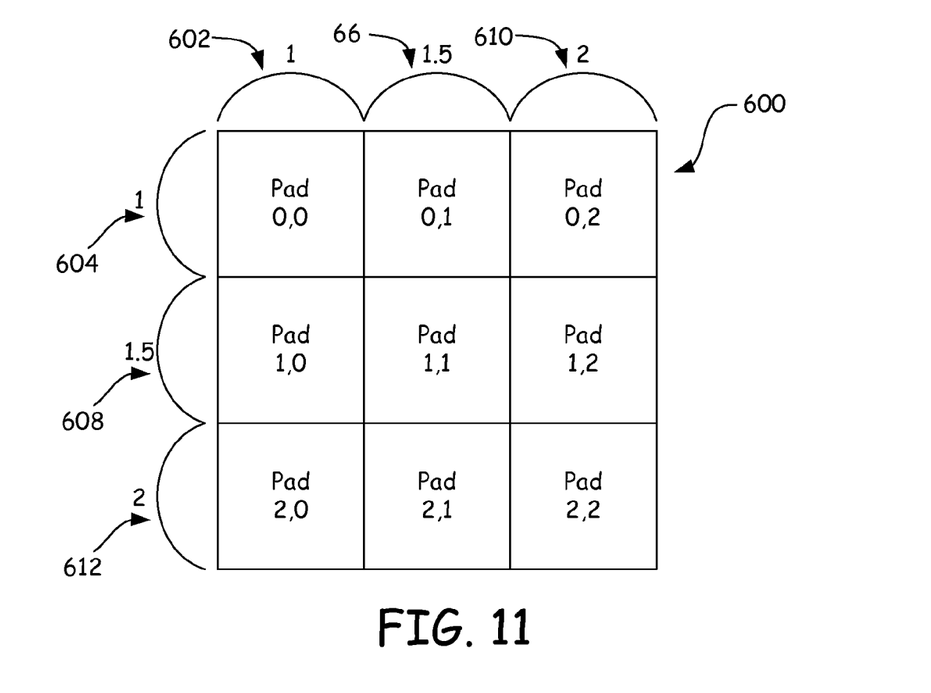
FIG. 11 illustrates a schematic diagram of the example array of adjacent capacitive sensors also illustrated in FIG. 10.

However, a weight of 0 is problematic when used as a multiplicative factor because it will zero out the contribution of that row or column. Therefore, a constant is added to the weights, such that none of the weights are equal to 0. FIG. 11 illustrates a schematic diagram of example array 600 of adjacent capacitive sensors including, for example and for simplicity, a value 1 added to the weights making the range of weights to be from 1 to 2. Written in equation form, the formula to calculate the fractional position in the X dimension for a 3×3 array is:

$$X = 1 * \frac{\sum_i C_{i,0}}{C_{Total}} + 1.5 \frac{\sum_i C_{i,1}}{C_{Total}} + 2 \frac{\sum_i C_{i,2}}{C_{Total}} - 1 \quad \text{(Equation 2)}$$

where i is a select row number, C is the capacitance value of a select capacitive sensor and $C_{Total}$ is the sum of all the modified capacitance values of each capacitive sensor in the array. By subtracting 1 (as indicated in equation 2), a weighted average value of the X coordinate of conductive element 120 between 0 and 1 across the three columns of a 3×3 array of capacitive sensors is given. Likewise, the formula to calculate the fractional position in the Y dimension for a 3×3 array is:

$$Y = 1 * \frac{\sum_j C_{0,j}}{C_{Total}} + 1.5 \frac{\sum_j C_{1,j}}{C_{Total}} + 2 \frac{\sum_j C_{2,j}}{C_{Total}} - 1 \quad \text{(Equation 3)}$$

where j is a select column number, C is the capacitance value of a select capacitive sensor and $C_{Total}$ is the sum of all the modified capacitance values of each capacitive sensor in the array. By subtracting 1 (as indicated in equation 3), a weighted average value of the Y coordinate of conductive element 120 between 0 and 1 across the three rows of a 3×3 array of capacitive sensors is given.

Equations 2 and 3 are multiplied by a constant to generate the coordinate range that is desired. For example, if values from 0 to 256 are desired, each of equations 1 and 2 can be multiplied by 256. This allows all of the calculations to be integer based, rather than floating point based, if care is taken to perform all the summations and multiplications before any divisions are taken to minimize any round off error. Further, multiplication by 256 can be performed by a simple shift by 8 in the software algorithm, thereby speeding the calculation and reducing code size. In addition, the division of $C_{Total}$ can be performed just once. Such a resulting expression for calculation of an X dimension can be:

$$X = 256 * \frac{\sum_i C_{i,0} + 3 * \sum_i C_{i,1} + 2 * \sum_i C_{i,2}}{C_{Total}} - 256 \quad \text{(Equation 4)}$$

and a Y dimension can be:

$$Y = 256 * \frac{\sum_j C_{0,j} + 3 * \sum_j C_{1,j} + 2 * \sum_j C_{2,j}}{C_{Total}} - 256 \quad \text{(Equation 5)}$$

Although the subject matter has been described in language specific to structural features and/or methodological acts, it is to be understood that the subject matter defined in the appended claims is not necessarily limited to the specific features or acts described above. Rather, the specific features and acts described above are disclosed as example forms of implementing the claims.

What is claimed is:

1. An input device comprising:
    an array of adjacent capacitive sensors arranged into rows and columns, each capacitive sensor exhibiting a capacitance characteristic when in proximity to a conductive element;

a plurality of mechanical hysteresis mechanisms that are each deposited on and in contact with one of the capacitive sensors and configured to be actuated by a corresponding push button, each capacitive sensor discharging an electrical charge upon actuation of the corresponding mechanical hysteresis mechanism;

each mechanical hysteresis mechanism comprises a first portion is-coupled to a corresponding one of the capacitive sensors and a second portion spaced apart from the corresponding capacitive sensor, and a plurality of ground pads, each ground pad corresponding to one of the capacitive sensors and being positioned between the capacitive sensor and the second portion of the corresponding mechanical hysteresis mechanism coupled to the capacitive sensor, wherein actuation of each of the mechanical hysteresis mechanism causes the mechanical hysteresis mechanism to come into contact with the ground pad; and an insulating overlay layer positioned over the array of capacitive sensors and the plurality of mechanical hysteresis mechanisms to define each push button and to define a surface for accommodating the conductive element.

2. The input device of claim 1, wherein the capacitance characteristic corresponds to a position of the conductive element on the surface of the insulating overlay layer.

3. The input device of claim 1, wherein each of the adjacent capacitive sensors arranged in rows and columns is coupled to another one of the capacitive sensors by a plurality of non-linear boundary edges.

4. The input device of claim 1, further comprising a controller, wherein each capacitive sensor is coupled to one of a plurality of input/output pins of the controller by a conductor.

5. The input device of claim 4, wherein each capacitive sensor is coupled to a power supply voltage.

6. The input device of claim 1, wherein each push button includes a protrusion for actuating the second portion of the corresponding mechanical hysteresis mechanism toward the corresponding ground pad.

7. A method of determining a position of a conductive element, the method comprising:

providing an input pad including an array of adjacent capacitive sensors arranged into rows and columns, each capacitive sensor exhibiting an increase in capacitance when in proximity to the conductive element;

providing mechanical hysteresis mechanism, each mechanical hysteresis mechanism corresponding to one of the capacitive sensors, each mechanical hysteresis mechanism having a first portion that is couple to the corresponding capacitive sensors, a second portion that is spaced apart from the corresponding capacitive sensor;

providing ground pads, each ground pad corresponding to the capacitive sensors and being positioned between the corresponding capacitive sensor and the second portion of the mechanical hysteresis mechanism, each mechanical hysteresis mechanism coming into contact with the corresponding ground pad upon an actuation of the mechanical hysteresis mechanism, timing a to logic transition interval for each capacitive sensor representing a charge transition of the capacitive sensor from a first voltage representing a first logical value to a second voltage representing a second logical value: generating capacitance values for each capacitive sensor abased on the logic transition interval of the capacitive sensor; and deriving a position of the conductive element on the input pad based on the capacitance values of each sensor and a proportional contribution of each row and column of the array of adjacent capacitive sensors.

8. The method of claim 7, wherein generating capacitance values for each capacitive sensor comprises obtaining an average of raw capacitance values for each capacitive sensor over a period of time.

9. The method of claim 8, further comprising subtracting a minimum capacitance value from each averaged raw capacitance value for each sensor, the minimum capacitance value represents a capacitance value that each sensor will return when the conductive element is distal from the capacitive sensor.

10. The method of claim 9, further comprising computing the minimum capacitance value by:

storing a running statistical relation of high capacitance values for each capacitive sensor;

storing a running statistical relation of low capacitance values for each capacitive sensor;

comparing a new capacitance value to a mid point between the low and the high capacitance values to add the new capacitance value to one of the statistical relation of high and low capacitance values; and selecting the statistical relation of low values as the minimum capacitance value.

11. The method of claim 9, further comprising computing the minimum capacitance value by:

storing a running statistically relative delta value of capacitance for the capacitive sensors, wherein the statistically relative delta value is the statistical relational difference between a statistical relation of low capacitance values and a statistical relation of high capacitance values;

comparing a new capacitance value to a threshold to determine if the new capacitance value be added to one of the statistical relation of low capacitance values and the statistically relative delta value; and selecting the statistical relation of low values as the minimum capacitance value.

12. The method of claim 7, wherein each row and each column is assigned a weight.

13. An input device comprising:

an array of adjacent capacitive sensors arranged into rows and columns that provide capacitance information, each row and column including a corresponding weight such that a position of a conductive element is determined based on the capacitance information of the capacitive sensors and the corresponding weights;

a plurality of push buttons that each corresponds to one of the capacitive sensors;

a plurality of mechanical hysteresis mechanism, each mechanical hysteresis mechanism being deposited on and in contact with one of the capacitive sensors and configured to be actuated upon the actuation of one of the push button, each mechanical hysteresis mechanism having a first portion coupled to a corresponding one of the capacitive sensors and second portion spaced apart from the corresponding capacitive sensor;

a plurality of ground pads that each corresponds to one of the push buttons, each ground pad being positioned between the corresponding capacitive sensor and the second portion of the corresponding mechanical hysteresis mechanism, each capacitive sensor providing electrical information upon actuating its corresponding push button to cause electrical coupling between the capacitive sensor and the corresponding ground pad to discharge an electrical charge from the capacitive sensor through the corresponding ground pad; and an insulating overlay layer that defines each push button and defines a surface for accommodating the conductive element.

14. The input device of claim 13, wherein each of the adjacent capacitive sensors arranged in rows and columns is coupled to another one of the capacitive sensors by a plurality of non-linear boundary edges.

15. The input device of claim 13, wherein the insulating overlay layer includes a plurality of cutouts for defining the push buttons.

16. The input device of claim 13, further comprising a controller, wherein each capacitive sensor is coupled to one of a plurality of input/output pins of the controller by a conductor and wherein each input/output pin of the controller is coupled to a power supply voltage through a resistor.

* * * * *